US006651331B2

(12) United States Patent
Eaton

(10) Patent No.: US 6,651,331 B2
(45) Date of Patent: *Nov. 25, 2003

(54) METHOD OF ESTABLISHING A THERMAL JOINT ON A HEAT SINK

(76) Inventor: Manford L. Eaton, 9202 Flint, Overland Park, KS (US) 66214

( * ) Notice: Subject to any disclaimer, the term of this patent is extended or adjusted under 35 U.S.C. 154(b) by 110 days.

This patent is subject to a terminal disclaimer.

(21) Appl. No.: 09/947,552

(22) Filed: Sep. 6, 2001

(65) Prior Publication Data

US 2002/0042995 A1 Apr. 18, 2002

Related U.S. Application Data

(63) Continuation-in-part of application No. 09/276,063, filed on Mar. 25, 1999, now Pat. No. 6,286,212, which is a continuation-in-part of application No. 08/654,701, filed on May 29, 1996, now Pat. No. 5,930,893.

(51) Int. Cl.[7] .................................................. B23P 15/26
(52) U.S. Cl. ...................... 29/890.03; 29/458; 165/185
(58) Field of Search ............................. 29/890.03, 428, 29/458; 165/185, 79, 133, 905; 361/704, 705, 707, 708

(56) References Cited

U.S. PATENT DOCUMENTS

| | | |
|---|---|---|
| 4,193,445 A | 3/1980 | Chu et al. |
| 4,299,715 A | 11/1981 | Whitfield et al. |
| 4,304,294 A | 12/1981 | Reisman et al. |
| 4,466,483 A | 8/1984 | Whitfield et al. |
| 4,471,837 A | 9/1984 | Larson |
| 4,473,113 A | 9/1984 | Whitfield et al. |
| 4,762,174 A | 8/1988 | Artus |
| 4,882,654 A | 11/1989 | Nelson et al. |
| 5,168,348 A | 12/1992 | Chu et al. |

OTHER PUBLICATIONS

DuPont brochure: "Ethylene–Vinyl Acetate Copolymer Resins Safety in Handling and Use".

DuPont brochure: "Elvax 300 Series Resins".

DuPont brochure: "Elvax 200 Series Resins".

J. appl. Chem. Biotechnol. 1974, 24, 81–91, Fischer–Tropsch Waxes, The Thermal Conductivity of Hard Wax.

"Fischer–Tropsch Waxes . . . Their production, properties and uses" by Charles J. Marsel, presented at C.S.M.A. meeting, Dec. 7, 1984.

DuPont brochure: "Elvax Resins for Molding, Compounding and Extrusion, a Grade Selection Guide".

Primary Examiner—I Cuda Rosenbaum
(74) Attorney, Agent, or Firm—Chase Law Firm, L.C.

(57) ABSTRACT

A method for depositing a thermal interface onto a heat sink including the selection of a highly thixotropic compound formed into a bulk form so as to present a tip which is melted upon contact with a preheated heat sink. The tip cross section preferably corresponds to the cross section of the heat sink. Upon depressing a tip of the compound against the heat sink a resulting vacuum therebetween cooperates with the ambient air pressure to preclude migration of the melted compound beyond the exterior of the tip such that the compound is deposited on the heat sink in the desired cross section form. Upon displacement of the tip from the heat sink, the ambient air pressure precludes subsequent migration of the compound onto the heat sink precluding a build up of the deposited material thereon. The component may then be subsequently pressed against the subsequent heat sink without a deformation of the compound tip precluding a subsequent deposit. Alternatively, after cooling the heat sink with pad may be reheated to melt the thermal pad for subsequent placement of a component thereon.

14 Claims, 4 Drawing Sheets

A: DESIRED SEMICONDUCTOR OPERATING TEMP.
B: COMPOUND MELT TEMP. >65°C
C: HIGHEST TEMP. ATTAINED BY SEMICONDUCTOR

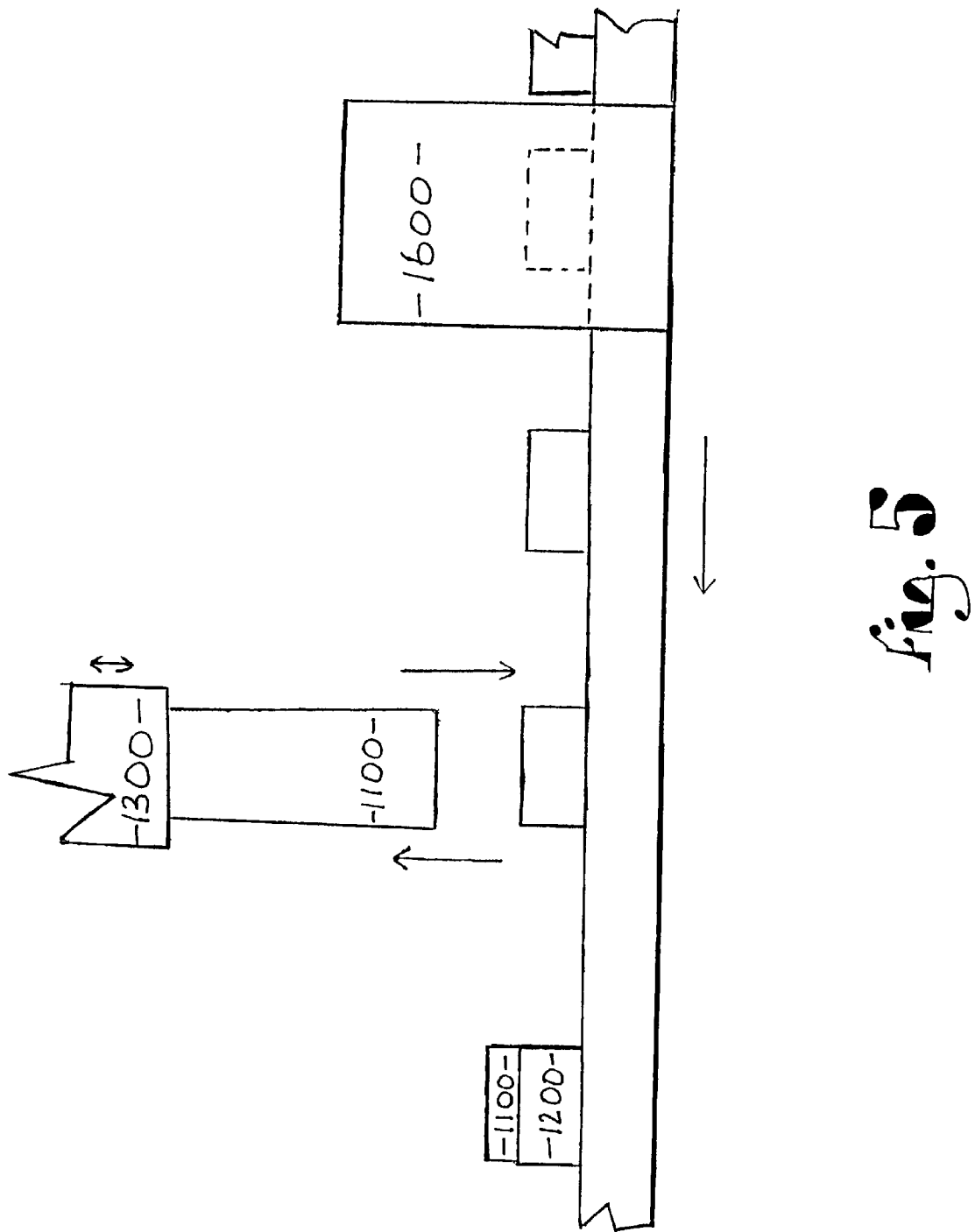

METHOD OF ESTABLISHING A THERMAL JOINT ON A HEAT SINK

CROSS REFERENCE TO RELATED APPLICATIONS

This application is a continuation-in-part of application Ser. No. 09/276,063, filed Mar. 25, 1999, now U.S. Pat. No. 6,286,212, entitled "Thermally Conductive Material and Method of Utilizing the Same", which is a continuation-in-part of U.S. Ser. No. 08/654,701, filed May 29, 1996, now U.S. Pat. No. 5,930,893, issued Aug. 3, 1999, entitled "Thermally Conductive Material and Method of Using the Same."

BACKGROUND OF THE INVENTION

This invention relates to a thermally conductive compound and method of constructing a low impedance, thermal interface/joint between an electronic component and a heat sink the compound having desired adhesive and closure force characteristics.

Electrical components, such as semiconductors, transistors, etc., optimally operate at a pre-designed temperature which ideally approximates the temperature of the surrounding air. However, the operation of electrical components generates heat which, if not removed, will cause the component to operate at temperatures significantly higher than its normal operating temperature. Such excessive temperatures can adversely affect the optimal operating characteristics of the component and the operation of the associated device.

To avoid such adverse operating characteristics, the heat should be removed, one such method being a conduction of the heat from the operating component to a heat sink. The heat sink can then be cooled by conventional convection and/or radiation techniques. During conduction, the heat must pass from the operating component to the heat sink either by surface contact between the component and the heat sink or by contact of the component and heat sink surfaces with an intermediate medium. In some cases, an electrical insulator must be placed between the component and heat sink. Thus, a heat-conducting path must be established between the component and the heat sink surfaces with or without an electrical insulator therebetween.

The lower the thermal impedance of this heat conducting path the greater the conductivity of heat from the component to the heat sink. This impedance depends upon the length of the thermal path between the component and heat sink as well as the degree of effective surface area contact therebetween.

As the surfaces of the heat sink and component are not perfectly flat and/or smooth, a full contact of the facing/mating surfaces is not possible. Air spaces, which are poor thermal conductors, will appear between these irregular mating surfaces and thus increase the path's impedance to conduction. It is thus desirable to remove these spaces by utilizing a heat conducting medium, the medium designed to contact the mating surfaces and fill the resulting air spaces. The removal of these air spaces lowers the path's thermal impedance and increases the path's thermal conductivity. Thus, the conduct of heat along the thermal path is enhanced.

Mica insulators with silicone grease thereon, the silicone grease containing "heat conducting particles," such as a metallic oxide, have been inserted between the component and heat sink to establish a thermal path. The grease can also be applied directly to the mating surfaces in an attempt to fill the resulting voids therebetween. However, the non-soluble grease is messy and can contaminate the equipment, clothing and personnel.

Another proposed solution was to coat a polymeric insulating gasket with a metallic oxide thereon, the gasket being inserted between the component and heat sink during assembly. Such oxides can be expensive, toxic and adhesion to the gasket can be difficult. Moreover, the gasket may not fully mesh with the irregular mating surfaces of the component and heat sink resulting in undesirable, inefficient air spaces therebetween.

The use of a compound comprising a paraffin wax with a softener such as petroleum jelly as the intermediate medium has been proposed in the Whitfield U.S. Pat. Nos. 4,299,715, 4,473,113, 4,466,483. The softener is intended to make the compound less brittle so it will not crack when coated onto the intermediate flexible insulator. However, this compound changes from a solid to a liquid state at the component's normal operating temperature which decreases its thermal conductivity. Also, the compound tends to flow away from the thermal path/joint which increases the impedance of the thermal path. Moreover, this flow can contaminate the surrounding surfaces.

Also, the use of softeners makes the resulting compound more susceptible to abrasion or chemical solvents. Thus, the compound can be rubbed off its substrate carrier during handling or component cleaning. Also, the "blocking temperature" of the compound is lowered, i.e., the temperature at which the coated carriers will stick to each other. (If the blocking temperature is equal to or lower than the room temperature, the coated carriers will stick to each other.) Also, the softeners make the compound stickier which makes it difficult to manipulate and susceptible to collection of foreign matters thereon. Such foreign materials can lead to component malfunctions, if not failure.

In response thereto I have invented a method of selecting a compound for establishing an efficient thermal joint between the surfaces of an electrical component and heat sink. With cognizance of a normal operating temperature of a selected component, the compound is selected to melt only during initial component operation by either external heat or a component temperature well above the component's normal operating temperature. Once initially liquified or sufficiently deformable, the clamping pressure of the component to the heat sink causes the compound to fill the spaces resulting in the thermal path between the heat sink and the component. This action presents a thermal path of low impedance which initiates an effective conduct of the heat from the component to the heat sink. The component temperature then falls to a temperature below the compound melt temperature and to its normal operating temperature which causes the compound to resolidify. Upon subsequent operation of the component, the component reaches only the components normal operating temperature as the previously established compound joint formed during initial component operation remains in a solid state. As the compound does not melt during subsequent component operation, a higher thermal conductivity is maintained. Moreover, as compounds of high molecular weight can be used in the above process, a higher thermal conductivity will result with or without the use of heat conductive particles.

I have also invented a simple method of applying a compound to a heat sink which is simple, cost effective and easy to use. The method basically utilizes a rod of preselected compound and cross section which is depressed against the heat sink for a selected length of time to leave a deposit of material thereon. The selection of certain characteristics of the compound material constricts the deposit to the cross-sectional area of the rod. The method is not limited to the particular compounds described herein.

As above discussed, the shorter the path between the component and heat sink the lower the thermal resistance. Thus, the lower the force required to reduce the thickness of the thermal compound interface the easier to reduce the thermal resistance of this path. This force must be coordinated with the closure force. By closure force I mean the aforementioned clamping pressure/force needed to initially join the component, thermal interface and heat sink.

It is known to have a film, e.g., a diamond film, along the component interface which serves as a "heat spreader". Any localized heat on the component will be dispersed along the film in all directions (isotropic) which enhances the transmission of the heat from the component to the heat sink.

The diamond films may be rigid, inflexible and fragile. In order to manipulate these films the film must have a thickness of at least a few hundred microns. However, these films result from a slow chemical vapor deposition process. The deposit process is a slow one, i.e., only about one micron/hour. In order to take advantage of the basic thin film and its high thermal conductivity, it is desirable to have a thermal interface compound that can interface the film with the component and heat sink at a very low closure force. Otherwise, the film will break at a high closure force.

It is also desirable that the interface material become flowable during initial component operation and/or deformable under low closure forces but not so flowable as to migrate away from the interface area. However, the interface material should not be so viscous that it requires high closure forces for component mounting which could damage the component or any associated "heat spreader" film.

Thermal resistance and closure forces are thus related. Since thermal resistance is lower when the thermal path is reduced, it is desirable that a very thin interface be formed at low closure forces. Otherwise, a large closure force may damage the component and/or intermediate film.

Most electrical components cannot withstand closure forces of more than 10–20 psi. The diamond film is even more sensitive to closure forces. Known interface materials require hundreds of psi to achieve a path having a low thermal resistance. Thus, a closure force problem exists. It is noted that the ASTM test standard on thermal phase change materials is done at 438 psi, well above the maximum closure force that should be applied to an electronic component. Thus, the problem may not be a recognized one.

It is desirable to have an interface material at room temperature that will change phase to a flowable state at elevated temperatures and/or deformable at low closure forces. The material should not be so viscous that it requires large closure forces to deform so as to obtain the desired component interface. The material should not migrate away from the component/heat sink under elevated temperatures or under closure forces. A very thin thermal interface at low closure forces should be created to preclude damage to the component and/or heat sink and/or any intermediate film therebetween.

The thermal material need not be used with a substrate carrier. A substrate increases the distance between the electrical component and the heat sink and thus increases the thermal resistance. Thus, the material should be free standing if a carrier is not desired.

Currently, pressure sensitive adhesive (PSA) strips along the edges of the thermal interface material adhere the thermal interface to the heat sink. However, these strips can only partially cover the interface material as the strips have high thermal impedance and increase the thermal path. At times these strips do not provide sufficient adhesion. Moreover, foreign matter can migrate between the PSA strips and the heat sink which increases thermal resistance.

Thus, the thermal interface material should be flexible, easy to handle at room temperature and dry to the touch. It also should flow at a temperature above room temperature and deform under low closure forces. The material should adhere to the heat sink and component surfaces but be removable therefrom by heat application. Also, the interface material should be able to be stored on the heat sink for transport and subsequent use.

In response thereto I have arrived at a process for selecting an interface compound that meets the above objectives as well as presents the following characteristics:

1. The interface material can be manufactured in sheet or roll form, cut to a desired shape and then placed on the heat sink for subsequent sandwiching between the electrical component and the heat sink or otherwise compressed on the heat sink for adherence upon cooling.

2. The interface material can be melted by either external heat or the heat generated by the initial component operation.

3. Upon cooling below its melt/phase change temperature, the material provides sufficient adhesion to maintain the electric component to the heat sink. Thus, mechanical fasteners, e.g., PSA strips, are not required.

4. As long as the operating temperature of the component remains below the melt/phase change temperature of the thermal interface material, the component remains firmly adhered to the heat sink.

5. The projection of external hot air onto the component will increase the thermal interface temperature so as to reduce the adhesive bond for component removal.

It is therefore a general object of this invention to provide an improved compound and method of selecting the same for reducing the impedance to heat flow through a thermal joint established between an electrical component and a heat sink while providing an effective adhesive bond.

Another object of this invention is to provide a compound and method, as aforesaid, which is initially liquified/deformable during initial component operation but remains in a solid state during subsequent component use.

A further object of this invention is to provide a compound and method, as aforesaid, wherein the compound does not melt at a subsequent normal operating temperature of the component but can be removed upon the application of external heat at a higher temperature thereto.

A more particular object of this invention is to provide a compound, as aforesaid, which is easily coated onto a substrate carrier for placement between the component and heat sink.

Another object of this invention is to provide a compound and method, as aforesaid, which provides a high thermal conductivity relative to previous compounds utilizing material softeners.

A further object of this invention is to provide a compound, as aforesaid, which is easy to manipulate and does not contaminate surrounding personnel and equipment.

Another particular object of this invention is to provide a compound, as aforesaid, which includes a material therein so as to avoid the problems associated with material softeners.

A further object of an embodiment of this invention is to provide a compound which initially adheres the electrical component to the heat sink at a low closure force.

Another object of this invention is to provide a compound, as aforesaid, which deforms under low closure forces of the component to the heat sink.

Still another object of this invention is to provide a compound, as aforesaid, which may be effectively utilized with "heat spreader" type films.

Another particular object of this invention is to provide a compound, as aforesaid, which can be used in sheet, roll or rod form and on printed circuit boards.

A further object of this invention is to provide a method of depositing a pad of compound acting as a phase change material on a heat sink.

Another object of this invention is to provide a method, as aforesaid, which produces a vacuum between the rod and heat sink to constrict the deposited compound material to the cross-sectional configuration of the end of the rod.

A particular object of this invention is to provide a method, as aforesaid, wherein the rod remains in stable form after repeated application.

Other objects and advantages of this invention will become apparent from the following description taken in connection with the accompanying drawings, wherein is set forth by way of illustration and example, an embodiment of this invention.

BRIEF DESCRIPTION OF THE DRAWINGS

FIG. 5 is a diagrammatic view illustrating a method for depositing a pad of the compound on a heat sink.

DESCRIPTION OF THE PREFERRED EMBODIMENT

Figure 1:
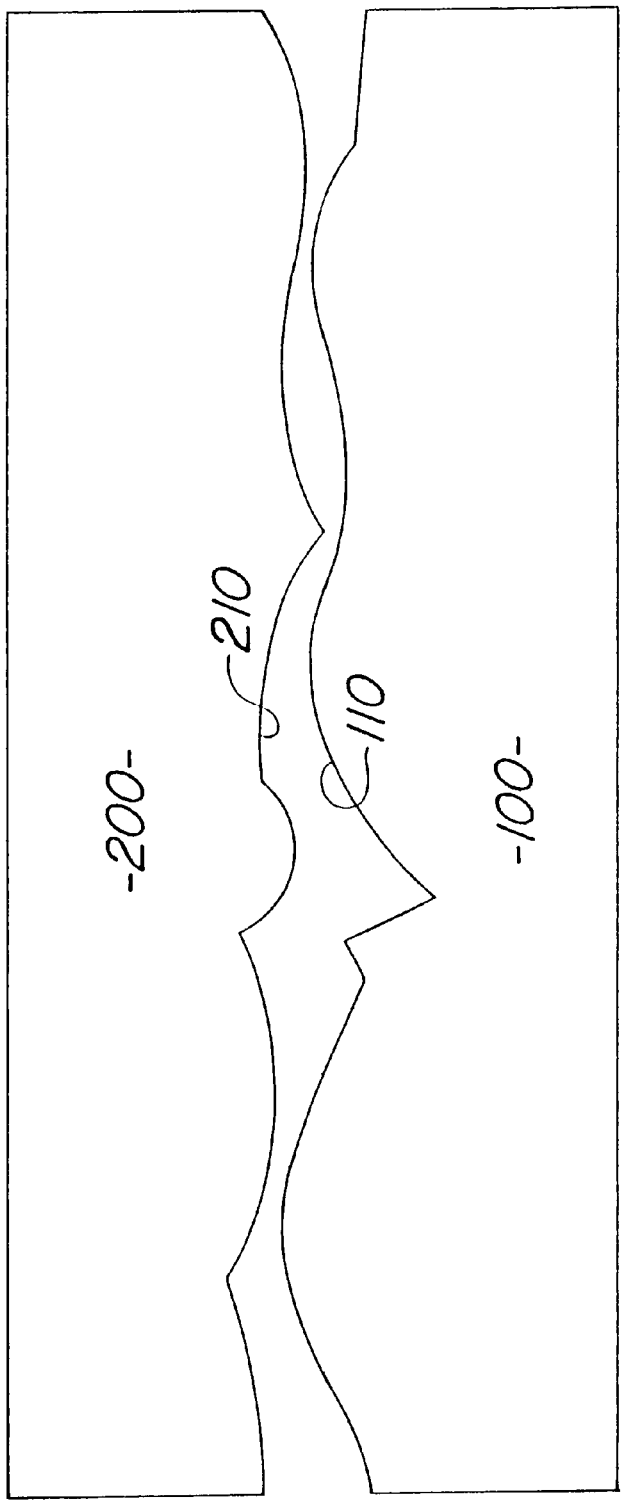
FIG. 1 is a diagrammatic view of the irregularities of the mating surfaces of an electrical component and a heat sink.

Turning more particularly to the drawings, FIG. 1 diagrammatically shows a surface 210 of an electrical component 200, e.g., as a transistor, semiconductor, etc., facing a heat sink 100 surface 110. It is understood that such surfaces 110, 210 are not smooth, such irregularities being diagrammatically shown. Upon mating the surfaces 110, 210, air spaces will appear between these irregular surfaces. As air is a poor conductor of heat, it is desirable to fill these resulting voids with a heat conducting medium so as to lower the impedance of the thermal joint/path 1000 established between the component 200 and heat sink 100. The lower the impedance of the thermal path the more efficient the conduct of heat from component 200 to heat sink 100.

Figure 2:
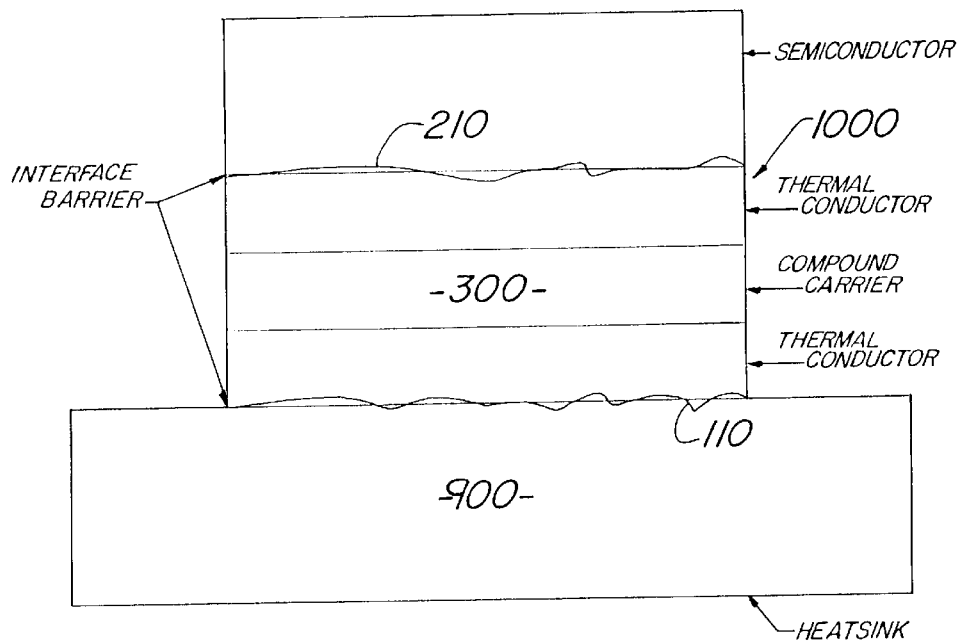
FIG. 2 is a diagrammatic view, on an enlarged scale, of a semiconductor and a heat sink with a compound coated on an intermediate carrier substrate.
Figure 3:
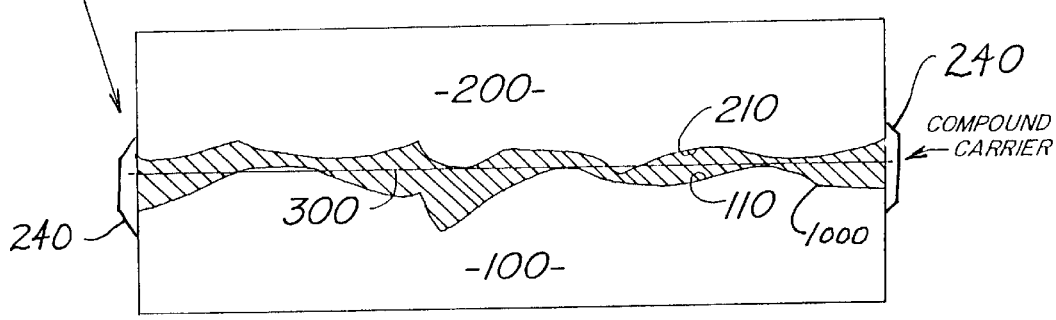
FIG. 3 is a diagrammatic view showing the compound, as coated on a carrier substrate, the substrate being positioned between the mating surfaces of an electrical component and heat sink.

FIG. 2 shows a compound carrier in the form of a flexible gasket 300 which may act as an electrical insulator between surfaces 110, 210. The gasket 300 may also be embedded with metallic oxide/heat conducting particles so as to enhance the heat conductivity along the thermal path 1000. However, as the gasket 300 alone may not fill all the air spaces appearing between the irregular mating surfaces 110, 210, the gasket 300 can act as a substrate carrier for a compound designed to fill these resulting air spaces.

I have devised a method of selecting a compound which can either be coated onto the facing surfaces of the component 200 or heat sink 100 or onto opposed surfaces of an intermediate carrier substrate 300 so as to optimally fill the resulting air spaces and present an efficient thermal joint between the component 200 and the heat sink 100.

The compound is selected so that it can be coated onto a substrate 300 and inserted between the component 200 and heat sink 100 during assembly. As the compound is initially in a solid state, it does not fill all the resulting voids between the mating surfaces 110, 210. Thus, during initial component 200 operation, the thermal path is an inefficient one. This inefficiency causes the component 200 to reach a temperature above its normal operating temperature as well as the melt temperature of the chosen compound. The operating component 200 will thus heat the compound to its melt temperature causing the compound to liquify or deform and fill the voids between the nominally mating surfaces 110, 210 of the component 200 and the heat sink 100. Once the voids are so filled an efficient thermal joint 1000 is established which enhances the conductivity along the thermal joint 1000. In turn, more heat flows from the component 200 to the heat sink 100 such that the component temperature is reduced to its normal operating temperature. During this component cool down, the compound temperature drops below its melt temperature which returns the compound to its solid state, the previously established joint 1000 being maintained.

Upon subsequent operation of the electrical component 200 the component 200 will heat only to its normal operating temperature as the previously established thermal joint 1000 conducts heat from component 200 to heat sink 100. The compound will not liquify/deform as the normal operating temperature of the component 200 remains below the compound's melt temperature. As the compound cannot liquify, it maintains a higher thermal conductivity relative to the conductivity of its liquid state. Moreover, as the compound will not flow away from the thermal joint the joint integrity is maintained.

Utilizing the above principles various compounds can be selected so as to achieve an efficient thermal joint 1000.

As a first example, a compound comprises 95 parts of a paraffin wax having a 51° C. melting point. To this paraffin I add five parts by weight a 28% ethylene/vinyl acetate copolymer hardener with a 74° C. melting point. One such copolymer is an Elvax resin available from the Dupont Company, Polymer Products Division of Wilmington, Dela. The element proportions are selected so that the resulting compound will have a melt temperature above the normal operating temperature of the component. Upon heating the compound to a temperature beyond its melt temperature, i.e., approximately 52° C., the viscosity of the compound will decrease so that a carrier 300 can be dip coated into the compound.

The carrier can be a 0.002 inch thick polymer insulating material with or without heat conducting materials impregnated therein. The compound resolidifies into a thin layer about 0.001 inch thick on the opposed surfaces of the polyamide carrier 300.

When the temperature of the electrical component reaches 80° C., the compound is heated beyond its melt temperature, i.e., 52° C., so as to fill the empty spaces appearing between the heat sink 100 and component 200 surfaces. This compound action will reduce the thermal impedance of the thermal joint 1000 between the component 200 and heat sink 100 such that the component 200 will eventually return to its normal operating temperature. (The thermal impedance of this compound is approximately 0.179 C/W.) As the component must initially operate beyond the compound melt temperature so as to heat the compound to its melt temperature, it is understood that by choosing a wax and copolymer with specific melt temperatures, the melt temperature of the resulting compound can be varied and chosen according to the initial and normal operating temperatures of the component.

Figure 4:
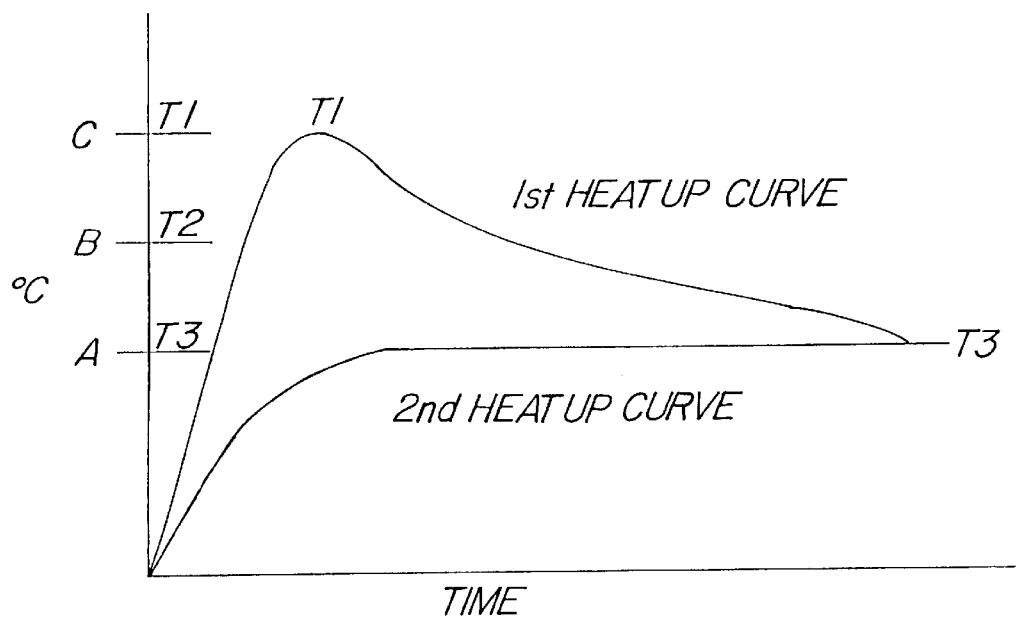
FIG. 4 illustrates first and second time/temperature curves of an electrical component in connection with using the selected thermally conductive material.

FIG. 4 diagrammatically relates the temperatures of the component 200 to the melt temperature of the compound. As shown in FIG. 4, the first heat up curve 900 of the component 200 shows the component reaching a maximum temperature at T1. Upon reaching this temperature, the compound will be heated beyond its melt temperature T2 so as to become sufficiently deformable to fill the spaces between the component surface 210 and heat sink surface 110. Upon these spaces being filled, the thermal impedance of the path between the component and the heat sink is reduced which reduces the temperature of the component 200 to the desired component operating temperature T3, this temperature being below the chosen compound melt temperature T2.

Upon a subsequent operation of the component 200, the curve 950 shows the temperature of the component 200 reaching a maximum of T3, the component's normal operating temperature. As the temperature of the component 200 will not increase beyond T3, due to the previously established efficient thermal joint 1000, the component temperature T3 remains below the compound melt temperature T2. Thus the compound will remain in a solid state during normal operation of the component, it being understood that the compound will have a higher conductivity than when in a liquid state. Thus, a more efficient conduct of heat through thermal joint 1000 will occur as compared to the prior art in which the compound is designed to liquefy.

Moreover, as the resulting compound will remain in a generally solid state at the normal operating temperatures of the component 200 and not phase into a liquid state the problems with the prior art have also been addressed, e.g., the elimination of the messy liquids and a compound flow away from the thermal joint.

It is also noted that as the initial heat up curve allows the component to heat beyond its normal operating temperature, compounds having high melt temperatures can be used. Thus, compounds having high molecular weights can be used, it being understood that such compounds have a better conductivity as opposed to compounds of lower molecular weight.

For example, a synthetic wax having a melt point of 100° C. and a molecular weight of approximately 1000 can be used, the wax being a type of wax known as a Fischer-Tropsch wax. The wax was coated onto a carrier 300 as above described. Upon initial operation of a semiconductor the semiconductor reached a temperature of 105° C. which melted the wax. Upon the wax establishing the thermal joint the temperature of the semiconductor fell to 82° C. The thermal conductivity of the wax at 150° C. is 0.191 W/mK while at 82° C. is 0.242 W/mK. As the compound will not reach its melt temperature during subsequent use, the thermal conductivity of the joint 1000 will be greater than if the compound is liquefied as found in the prior art.

Accordingly, it is desirable to have the electrical component initially heat to a temperature considerably above its normal operating temperature so as to melt the compound. Thus, the addition of the Elvax to the wax or the use of a wax of a high molecular weight can be used which results in a material which initially presents an inefficient thermal joint. (It is noted that the compound should also be relatively hard and undeformable by the normal mounting/clamping forces utilized in mounting the component to the heat sink.) This inefficient thermal joint allows the component 200 to heat to a temperature which will melt the component so as to establish a thermal joint between the component 200 and heat sink 100. This joint will reduce the component temperature and allow the compound to resolidify. Due to this joint 1000 presence, the component 200 will not reach a temperature to subsequently melt the compound. Thus, the integrity of joint 1000 is maintained. Moreover, the use of the Elvax hardener in the compound or use of a medium of high molecular weight solves the problems associated with the prior art.

Although the above has been discussed without the use of any heat conducting particles in the compound or barrier, it is also understood that heat conducting particles may also be used which may further decrease the thermal impedance of the thermal joint/path.

As above set forth, I have described an interface compound in which the heat needed for melting may be generated by the component itself. Also, it is advantageous to use externally applied heat to either initially cause a flow and/or reflow the compound interface. The application of external heat to the compound interface can be utilized as most electrical components can withstand externally applied heat above its maximum operating temperature. It is also desirable that when the component cools and the compound interface returns to a solid state that it presents an adhesive characteristics sufficient to adhere the component and heat sink thereto.

It is also advantageous that the compound be deformable at low closure forces so as to assist the migration of the compound into the air spaces whether prior to or after the compound is melted.

It is also advantageous to vary the compound interface formulation so that the compound interface can have various adhesion characteristics at different temperatures for use with various low closure forces.

In some applications the components and the heat sink must be separated by an electrically insulating medium. In other applications it is not required and in these cases a thermally conductive compound can also be electrically conductive.

To achieve these characteristics I have discovered one compound which comprises 25 parts of paraffin wax having a melting point of 51° C. To this paraffin I add six parts by weight of 28% ethylene/vinyl acetate copolymer having a melt temperature of approximately 74° C. Such copolymer is an Elvax resin available from the DuPont Company. To this mixture 69 parts by weight of zinc oxide heat conducting particles may be added. These ingredients are mixed together. These proportions are found to provide a compound having a melt temperature of about 57° C. as well as provide the following values:

A thermoplastic material with sufficient cohesiveness which can be laminated, molded, die-cut and physically handled during normal installation without disintegrating.

A thermoplastic material which can firmly hold electric components to heat sinks. The adhesive bond between the components and the aluminum heat sink is about 25 psi.

A thermoplastic material which is easily deformed under low closure forces on electronic components to form a very thin interface, the closure forces being below a fracture force damaging the component.

A thermoplastic material which will not migrate away from the interface area during closure forces and subsequent component operation.

I have simultaneously achieved the above characteristics with the last above-described formulation. It is noted that the reduction of the wax from the first described example from 95 parts to 25 parts along with an increase of the copolymer from five to six parts, increases the adhesion characteristic of the compound.

My invention is, however, not to be limited to the above-described example as the materials of various melt temperature and proportions can be used to vary the compound melt temperature depending on the operating temperature of the component to be used thereon. The melt temperature in the latter example approaches that of the wax (51° C.) as the proportion of wax is greater than the co-polymer. (Formulas for computing a compound melt temperature based on the melt temperatures of the compound parts are known.) For example:

$$MT=(MT1\times \%M1)+(MT2\times \%M2)$$

where MT=compound melt temperature
MT1=material 1 melt temperature
MT2=material 2 melt temperature Thus, various modifications may be made by choosing different characteristics, e.g., the melt points for the paraffin and the acetate copolymer. For example, if the wax and copolymer components had the same 74° C. melt temperature, the compound will have a 74° C. melt temperature. The adhesion will be about 25 psi up to this 74° C. melt temperature. If, however, the melt temperature of the paraffin is considerably higher (100° C.) than the copolymer, the adhesiveness of the compound would begin to diminish from about 25 psi at 74° C. to almost 0 psi at 100° C. as the adhesive quality decreases after the copolymer melt temperature is reached. Although an increase in the copolymer parts will increase the adhesion characteristics, this increase must be balanced against the increase in viscosity and stickiness of the compound. Also any increase in the wax percentage in the compound must be balanced against the increase in fluidity of the resulting compound.

It is also understood that particles which are electrically conductive can be utilized. The use of electrically conductive metal particles rather than the electrically insulating metal oxide particles can enhance the heat transfer through the interface material. As such, I have used very small size metallic silver particles instead of the zinc oxide particles in the above example. The same volume as the volume of zinc oxide was used. In both examples, the above features were obtained.

As an example of use, a compound interface similar to the one above described (25 parts wax/six parts copolymer) was screen printed via a stencil of appropriate thickness onto a preheated aluminum heat sink to present a 0.005 inch pad. The heat sink was preheated to a temperature above the reflow/melt temperature of the compound. When the heat sink cooled to room temperature the thermal pad was firmly adhered to the heat sink surface.

The above compound interface can also be extruded in bulk, e.g., to form rods of material having various cross sections, e.g., various square, round, etc. shapes. The rod is pressed against a heat sink preheated above the compound melt temperature. This contact and removal of the rod deposits a pad of the thermal material thereon. The electric component is then pressed against the thermal pad which further flows the thermal material. Upon cooling, a very low thermal resistance of the thermal interface occurs between the heat sink and component with a bead 240 of the compound interface formed around the exterior of the component at its juncture with the heat sink. The compound interface firmly adheres the heat sink to the component.

The above interface may be first applied to the heat sink for later connection of the component thereto upon heating the heat sink and interface material to the melt temperature with external heat or using the heat of component operation. The interface may be utilized with hot melt glue equipment as well as in computer controlled syringes for deposit on the desired heat sink surface and/or component surface. This resulting bead precludes dirt from entering the thermal interface.

Another example is that the compound interface can be screen printed onto circuit boards 900. The soldering paste can then be screen printed onto the board. A clamping device then clamps the components to the circuit board with the compound interface therebetween. The closure force provided by the clamping device may initially cause deformation to the underlying compound to cause an initial compound migration/flow. The board can then be placed in a soldering oven which simultaneously solders the components and causes the compound interface to flow creating the desired thermal interface.

The above compound may also be utilized with computer controlled syringes or with melt glue equipment to deposit the compound interface on the desired surface.

I have also invented a method for efficiently depositing a pad of the compound interface on a heat sink which can be utilized with various types of interface materials.

Thermal interface materials, e.g., the above-identified materials, may be formed into sheets or rolls of material which are then die-cut and supplied on sheets or rolls. This method requires significant labor.

If due-cut, the interface material must be first manufactured according to a desired configuration and then manually installed which includes the following operations:

(1) The interface material must be between two release liners;

(2) The interface material with release liners must then be die cut to the desired configuration;

(3) The release liners must be removed prior to installation;

(4) The material must then be installed on the heat sink.

Expensive equipment must be used to dispense the phase change material on the heat sink. This equipment requires frequent clean up and maintenance, and is not easily adaptable to modification. Dispensers, which pre-melt the phase change material inside the dispenser, for subsequent "painting" of the material onto the heat sink surface are also known.

The present invention provides a method which uses a preselected material formulation that remains form stable even after repeated applications. As such the material allows a simple method allowing simple equipment to be used, i.e., a simple vertically reciprocative arm to apply the material to preheated heat sink passing thereunder.

The above-described phase material can be any material as long as it is highly thixotropic, e.g., a wax-based thermoplastic (not thermosetting) so that it can readily melt and resolidify.

This phase change material is extruded, molded or otherwise formed into a rod having a desired cross-section corresponding to the configuration of the heat sink. The rod 1100 can then be manually depressed onto the heat sink 1200 and be installed into a vertically reciprocative arm 1300, the arm being either manually controlled or computer controlled in a timed up and down movement.

The heat sink 1200 to which the pad of thermal interface material may be preheated by any convenient method, e.g., heat lamp, hot plate, conveyor oven 1600, etc. The heat sink should be heated to a temperature above the phase change temperature of the selected material of the above thermal compound rod but should not exceed the maximum operating temperature of this thermal interface material. For a material with a 52° C. phase change temperature, the minimum heat sink 1200 temperature should be about 60° C. so as to ensure that the heat sink 1200 is adequately heated to melt the thermal material. (Most wax containing materials should not be heated above about 200° C. so this would be the maximum heat sink temperature.) The exact temperature is not critical.

Once the heat sink 1200 is heated, the rod 1100 is simply depressed vertically against the heat sink 1200 for a few seconds, then removed. The viscoelastic properties of most phase change thermal materials causes the tip of the rod 1100 to deform when melted and pressed against a heated surface. Normally, repeated application of a rod tip to heated surfaces makes the tip become progressively larger and deformed. However, in the present invention the thixotropic and viscoelastic properties of the thermal material are chosen to prevent the melted material at the rod tip from flowing beyond the dimensions of the rod. Such material will create a vacuum between the molten tip and the heated heat sink 1200 surface. The thermal material is chosen to have a highly thixotropic characteristic such that the molten material of the rod tip will not flow laterally under its own weight. Thus, when the rod is pressed against the heated heat sink surface the phase change material at the tip of the rod melts. The weight of the material causes a deposit on the heat sink as a vacuum has been formed between the rod tip and heat sink 1200. However, as soon as the molten material tries to flow beyond the edges of the tip of the rod, the air pressure about the outside of the rod precludes the thixotropic material from flowing therebeyond. Thus, the molten material is constricted to the perimeter of the cross section of the rod. As such, removal of the rod tip from the heat sink helps to retain the shape and size of the rod tip for subsequent application.

Because of these preselected properties of the thermal compound, repeated applications to the heat sink does not deform the rod tip and produces essentially the same size and thickness of a deposited thermal pad with each application. Thus, an entire rod can be used with the final deposited thermal pad on the heat sink being substantially the same as the first deposited pad.

Upon movement of the rod away from the heat sink 1200, a pad of molten, thermoplastic, thermal material, corresponding to the cross section of the rod end is deposited on the heat sink. Due to the combination of the air pressure, vacuum and thixotropic characteristic of the material, the rod material will not drip, migrate or leave a "peak" of material vertically projecting from the deposited thermal pad.

After deposit, two alternative courses of action may follow:

1) The heat sink is allowed to cool, shipped and stored for later installation of the electronic component on the heat sink. In this case heat from component operation will again reflow the thermoplastic thermal material and create a very thin, low thermal resistance thermal interface assuming the above-identified material is utilized.

2) While the thermal material is still molten, the electronic component may be pressed against the molten thermal material such that the material forms a very thin thermal interface between the heat sink and component. When the heat sink cools below the phase change temperature of the thermal compound, the thermal interface material, as above described, solidifies and firmly adheres the component to the heat sink. The assembly can now be shipped or stored without worry about the shelf life or thermal degradation due to deterioration of a pressure sensitive adhesive on the thermal pad surface.

These thermal material rods can be used manually or in simple, automatic equipment which holds the rods vertically and bring the rods down onto the conveyed heated heat sink surface to achieve increased repeatability of position, force and dwell time of the rod on the heat sink. Thus, the same rod can be used for manual application as well as high-speed volume production.

EXAMPLES OF THE MATERIAL

A thermal compound is formed by mixing:

4.25 parts by weight of Paraffin Wax having a melt point of 52° C.

1 part by weight of Ethylene-Vinyl Acetate Copolymer (Elvax) having a melt temperature of 71° C.

11.5 parts by weight of finely divided Zinc Oxide powder

In some cases a surface-active agent may be used as known to those skilled in the art. The amount of heating conducting particles can be varied over a considerable range.

The amount of ZnO used in such formulations should be sufficient to make the viscosity of the material high enough that the material will not migrate or flow in typical electronics interface applications. The viscosity of the resulting compound, when in the molten state is approximately 80 to 100 poises.

After thorough mixing the resulting thixotropic, highly viscous thermal material was formed into rods of material using an extruder.

Rods 0.5×0.5"×8" long were produced to create thermal pads as above described. The shape and size of the thermal pads produced by the rod was substantially the same at the end of the rod as at the beginning.

The data below shows the typical operating parameters for use of the rods, i.e., a heat sink temperature of 65° C.; pressure on rod of five to 10 psi and a dwell time of one second resulting in a pad thickness of 0.003".

The temperature can vary considerably without great variation in the pad that is created on the heat sink.

For example, utilizing the same material in connection with a heat sink temperature of 75° C.; a pressure on rod of five to 10 psi and a dwell time of one second resulted in a pad thickness of 0.003".

Accordingly, variations in the heat sink temperature may not have a significant effect on the resulting pad thickness. Testing can be easily accomplished to find a maximum heat sink temperature which does not affect the deposit.

Accordingly, it is understood that various compound materials may be used with my method as long as the selection of the compound is guided by the above-desired characteristics. Once chosen tests can be conducted as to temperature, dwell time and viscosity to assure that an undesirable migration of the rod material does not occur beyond the perimeter of the rod cross section.

Other objects and advantages of the above embodiments will become apparent from the above description taken in connection with the accompanying drawings.

It is to be understood that while certain forms of this invention have been illustrated and described, it is not limited thereto, except in so far as such limitations are included in the following claims and equivalents thereof.

Having thus described the invention, what is claimed as new and desired to be secured by Letters Patent is as follows:

1. A method of establishing a thermal joint on a heat sink comprising the steps of:
    choosing a compound having a melt temperature above a normal operating temperature of a selected electrical component and a desired adhesion characteristic, said compound in a bulk form having a tip with a cross sectional area corresponding to a desired configuration of a compound deposit on a heat sink, said compound having a highly thixotropic characteristic so that the compound upon melting does not flow beyond a perimeter of said tip;
    choosing a heat sink;
    elevating the temperature of the heat sink to preheat said sink to at least said compound melt temperature;
    depositing a preselected amount of said compound on said heat sink by pressing said tip of said compound bulk against said preheated heat sink for a preselected time;
    cooling said deposited compound whereby to adhere said compound to said heat sink corresponding to said adhesion characteristic.

2. A method of establishing a thermal joint on a heat sink comprising the steps of:
    choosing a compound having a melt temperature above a normal operating temperature of a selected electrical component and a desired adhesion characteristic;
    choosing a heat sink;
    elevating the temperature of the heat sink to preheat said sink to at least said compound melt temperature;
    depositing a preselected amount of said compound on said heat sink;
    urging an electrical component against said compound deposit;
    cooling said deposited compound whereby to adhere said compound to said heat sink corresponding to said adhesion characteristic.

3. A method of establishing a thermal joint on a heat sink comprising the steps of:
    choosing a compound having a highly thixotropic characteristic, whereupon an ambient air pressure precludes a flow of said compound;
    choosing a heat sink;
    elevating the temperature of the heat sink to preheat said sink to said at least a melt temperature of said chosen compound;
    depositing a preselected amount of said compound on said heat sink;
    urging an electrical component against said compound deposit;
    cooling said deposited compound whereby to adhere said compound to said heat sink.

4. The method as claimed in claim 2 wherein said urging step is at a force to present said compound at a desired thickness between said component and heat sink.

5. The method as claimed in claim 2 wherein said urging step is at a force below a fracture force of the component.

6. The method as claimed in claim 2 wherein said component includes a heat dissipating film thereon, said urging step being at a force below a fracture force of a said film.

7. The method as claimed in claim 1 wherein a vacuum is created between said tip and said heat sink upon said pressing of said tip against said heat sink, said vacuum cooperating with an air pressure about said perimeter of said tip to inhibit a migration of said melted compound at said tip beyond said perimeter.

8. The method as claimed in claim 3 further comprising the steps of:
    displacing said tip of said compound bulk away from said heat sink, said displacement of said tip away from said heat sink allowing an ambient pressure against said tip to preclude migration of said compound away from said tip.

9. A method of establishing a thermal joint on a heat sink comprising the steps of:
    choosing a compound having a highly thixotropic characteristic, whereupon an ambient air pressure precludes a flow of said compound, said compound in a bulk form having a tip with a cross sectional area corresponding to a desired configuration of said compound deposit on a heat sink;
    choosing a heat sink;
    elevating the temperature of the heat sink to preheat said sink to said at least a melt temperature of said chosen compound;
    depositing a preselected amount of said compound on said heat sink by pressing said tip of said compound bulk against said preheated heat sink for a preselected time to melt said tip for deposit of said compound on said heat sink, said highly thixotropic characteristic urging said compound to a hardened state so that said compound does not flow beyond an exterior boundary of said tip upon an air pressure acting thereon;
    cooling said deposited compound whereby to adhere said compound to said heat sink.

10. The method as claimed in claim 9 wherein a vacuum is created between said tip and said heat sink upon said tip approaching said heat sink, said vacuum cooperating with an air pressure about an exterior of said tip to inhibit migration of said compound at said tip beyond a perimeter of said tip.

11. The method as claimed in claim 10 further comprising the steps of:
    displacing said tip of said compound bulk away from said heat sink, said compound characteristic precluding a migration of said compound away from said tip upon said displacing step.

12. The method as claimed in claim 3 wherein said urging step is at a force to present said compound at a desired thickness between said component and heat sink.

13. The method as claimed in claim 3 wherein said urging step is at a force below a fracture force of the component.

14. The method as claimed in claim 3 wherein said component includes a heat dissipating film thereon, said urging step being at a force below a fracture force of a said film.

* * * * *